United States Patent
Alvarez Valenzuela et al.

(10) Patent No.: US 8,446,206 B2
(45) Date of Patent: May 21, 2013

(54) CURRENT BALANCING OF PARALLEL CONNECTED SEMICONDUCTOR COMPONENTS

(75) Inventors: Rodrigo Alonso Alvarez Valenzuela, Dresden (DE); Karsten Fink, Werl (DE); Steffen Bernet, Dresden (DE); Antonio Coccia, Baden (CH)

(73) Assignee: ABB Research Ltd, Zürich (CH)

( * ) Notice: Subject to any disclaimer, the term of this patent is extended or adjusted under 35 U.S.C. 154(b) by 97 days.

(21) Appl. No.: 13/215,816

(22) Filed: Aug. 23, 2011

(65) Prior Publication Data

US 2012/0043994 A1  Feb. 23, 2012

(30) Foreign Application Priority Data

Aug. 23, 2010 (EP) ..................... 10173694

(51) Int. Cl.
*H03K 17/56* (2006.01)
(52) U.S. Cl.
USPC .............. 327/424; 327/92; 327/423; 327/494
(58) Field of Classification Search
USPC ................... 327/92, 423–424, 494, 508, 587, 327/588
See application file for complete search history.

(56) References Cited

U.S. PATENT DOCUMENTS

| | | | |
|---|---|---|---|
| 5,530,639 A * | 6/1996 | Schulz et al. | 363/17 |
| 5,889,663 A | 3/1999 | Tabata et al. | |
| 6,710,580 B2 * | 3/2004 | Shinba | 322/37 |
| 6,801,443 B2 * | 10/2004 | Manthe | 363/56.12 |

OTHER PUBLICATIONS

European Search Report issued on Feb. 9, 2011, for European Application No. 10173694.0.
J.-F. Chen et al., The Techniques of the Serial and Paralleled IGBTs, 1996 IEEE, pp. 999-1004 vol. 2.
H. Miyazaki et al., "Neutral-point-clamped inverter with parallel driving of igbts for industrial applications," IEEE Transactions on Industry Applications, vol. 36, No. 1, pp. 146-151, Jan./Feb. 2000.
C. Abbate et al., Series Connection of High Power IGBT modules for traction applications, pp. 1-8.
Jan Thalheim et al., A New Approach for Controlling Series-Connected IGBT Modules, 2001, pp. III-69-III72.

(Continued)

*Primary Examiner* — Lincoln Donovan
*Assistant Examiner* — Brandon S Cole
(74) *Attorney, Agent, or Firm* — Buchanan Ingersoll & Rooney PC

(57) ABSTRACT

A method and an arrangement are provided for balancing the switching transient behavior of parallel connected power semiconductor components. The method includes providing a switch signal to the parallel connected power semiconductor components for changing the state of the components, forming control signals for each of the parallel connected components from the switch signal, and determining, during the change of state of the power semiconductor component, the voltage induced to an inductance in the main current path of the component in each of the parallel connected components. The method also includes comparing each of the induced voltages with a predetermined threshold voltage, measuring time differences between the time instants at which the induced voltages crosses the threshold voltage, and modifying one or more of the control signals on the basis of the measured time differences in the respective following state change for balancing the switching transient behavior.

26 Claims, 8 Drawing Sheets

OTHER PUBLICATIONS

S. Musumeci et al., Parallel Strings of IGBTs in Short Circuit Transients: Analysis of the Parameter Influence and Experimental Behavior, 2002, pp. 555-560.

Yalan Wang et al., Controlled Switching of High Voltage IGBTs in Series, 2003, pp. 297-300.

Robert Hermann, Investigation of the parallel connection of Integrated Gate Commutated Thyristors and diodes for high current converters, PhD. Thesis, TU-Berlin, May 2009, pp. 1-180.

D.W. Auckland et al, Digital synchronisation of switching transistors, IEE Proceedings, vol. 135, Part B, No. 2, Mar. 1988, pp. 97-101.

P. Hofer et al. Paralleling intelligent IGBT power modules with active gate-controlled current balancing, Power Electronics Specialists Conference, 1996, pp. 1312-1316.

D.W. Auckland et al., Control method for compensation of switching delays in transistors, IEE Proc., vol. 129, Part B., No. 4, Jul. 1982, pp. 199-204.

Dominik Bortis et al., Active Gate Control for Current Balancing of Parallel-Connected IGBT Modules in Solid-State Modulators, IEEE Transactions on Plasma Science, vol. 36, No. 5, Oct. 2008, pp. 2632-2637.

* cited by examiner

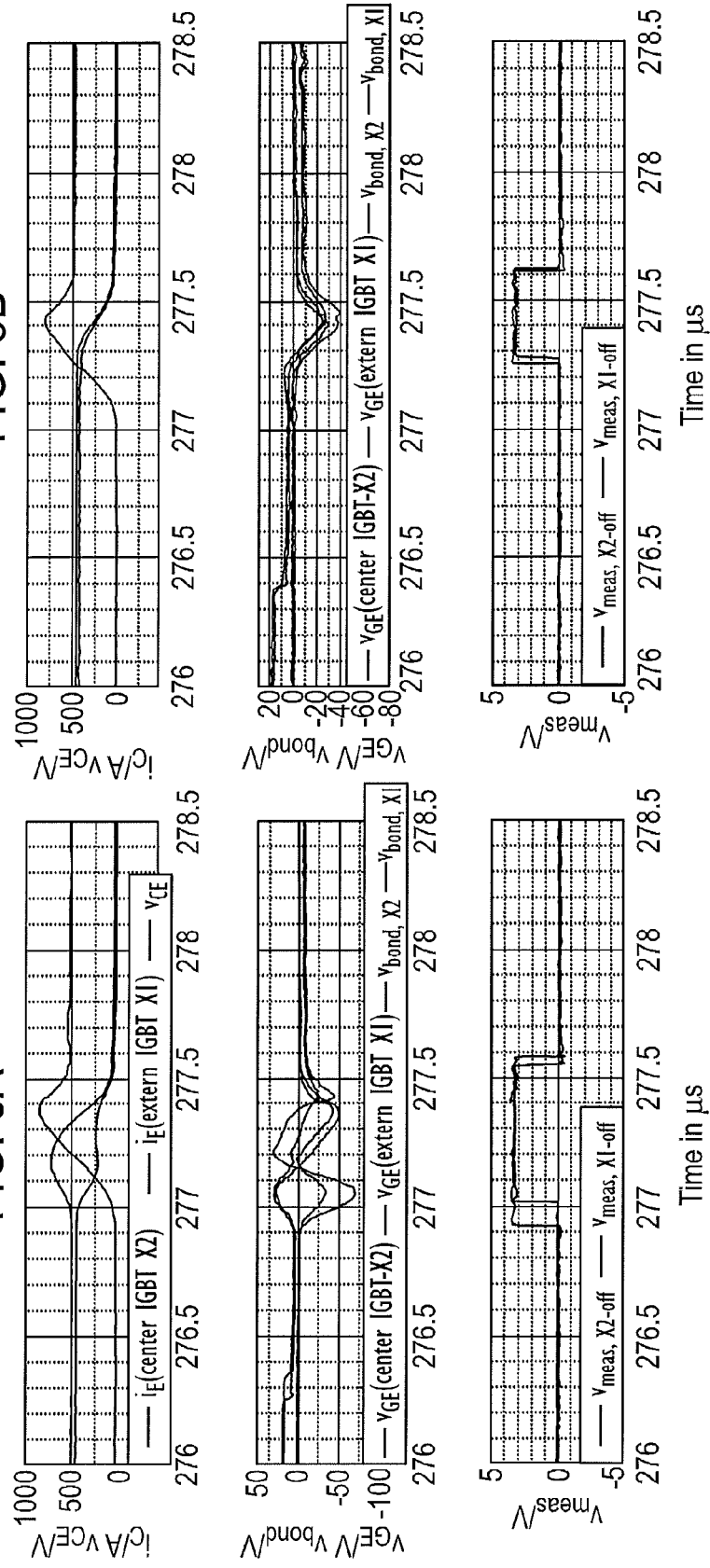

CURRENT BALANCING OF PARALLEL CONNECTED SEMICONDUCTOR COMPONENTS

RELATED APPLICATION

This application claims priority under 35 U.S.C. §119 to European Patent Application No. 10173694.0 filed in Europe on Aug. 23, 2010, the entire content of which is hereby incorporated by reference in its entirety.

FIELD

The present disclosure relates to balancing of currents of parallel connected semiconductor components, and more particularly, to balancing the currents in dynamic situations.

BACKGROUND

The increasing demand for large power ratings and the physically limited maximum current density of semiconductor devices has led to the development of a parallel connection of semiconductors for high power applications. The parallel connection of power semiconductor components, such as IGBTs, is a widely distributed solution for high power converters. In parallel operation of IGBTs, each parallel connected component receives the switch signal. The switch signal may be originated, for example, from a modulator which decides the appropriate timing for the switching action to take place. The switch signal is divided into control signals for controlling each of the parallel connected components. The intention is thus to operate the switches simultaneously, so that the total current would be divided equally between the components.

However, a current unbalance of the parallel components can occur with the IGBT parallel connection. Current unbalances may occur during the on-state (static operation) and/or switching transients (dynamic operation). In the static operation, current unbalance results in, for example, differing temperatures between the components, which causes the components to age differently and prematurely.

Unbalance in the dynamic operation refers to different behavior of the components during the state changes (e.g., during commutation times at turn-off and turn-on). The simultaneous operation of parallel connected components is desirable so that the changes of current in different current paths are equal in magnitude. Changes in current cause large voltage spikes in the inductances of the current path. It is desirable to have similar current behavior in parallel branches, so that the induced voltages also have similar waveforms. For example, for turn-on, delays in commutation may also lead to situations in which the current rating is exceeded during the commutation when the fastest component takes most of the current intended for parallel operation.

There have been attempts to achieve dynamic current balance between parallel connected power semiconductors by selecting the paralleled components according to certain device parameters (e.g., gate emitter threshold voltage, switching times, on-state voltage, etc.). This approach involves additional manual work carried out by the component manufacturer or by the end user, leading inherently to additional costs.

Another measure to tackle the problem of dynamic current unbalance is to use current balancing networks, as suggested in documents [1], [2], [3], and [7] identified below. However, current balancing networks add costs, volume, weight and losses to the electrical system.

The dynamic current balance may also be achieved by manually setting parameters of the gate units driving the semiconductor components. This settable parameter may be, for example, the gate resistance $R_g$. Also, this procedure involves manual measurements and may take a long time.

Another possibility is to control the rates of current with the gate units, as suggested in documents [4], [5] and [6] identified below. This solution brings complexity and cost to the system together with higher switching losses since the state changes are prolonged.

Document [7] identified below discloses that the converter can be realized in a symmetric manner regarding stray inductances by proper mechanical layout and design. Such a layout and design leads to additional material, development and manufacturing costs. Further, this kind of design leads to a physical structure, which makes the service of the device complicated and difficult.

SUMMARY

An exemplary embodiment of the present disclosure provides a method of balancing switching transient behavior of parallel connected power semiconductor components. The exemplary method includes providing a switch signal to the parallel connected power semiconductor components to change a state of the components, and forming control signals for each of the parallel connected components from the switch signal. The exemplary method also includes determining, during the change of state of the power semiconductor components, a voltage induced to an inductance in a main current path of each component, respectively, and comparing each of the induced voltages with a predetermined threshold voltage. In addition, the exemplary method includes measuring time differences between time instants at which the induced voltages cross the threshold voltage, and modifying at least one of the control signals on the basis of the measured time differences in a respective following state change of the components for balancing the switching transient behavior.

An exemplary embodiment of the present disclosure provides an arrangement of balancing switching transient behavior of parallel connected power semiconductor components. The exemplary arrangement includes means for providing a switch signal to the parallel connected power semiconductor components for changing a state of the components, and means for forming control signals for each of the parallel connected components from the switch signal. The exemplary arrangement also includes means for determining, during the change of state of the power semiconductor components, a voltage induced to an inductance in a main current path of each component, respectively, and means for comparing each of the induced voltages with a predetermined threshold voltage. In addition, the exemplary arrangement includes means for measuring time differences between time instants at which the induced voltages cross the threshold voltage, and means for modifying at least one of the control signals on the basis of the measured time differences in a respective following state change of the components for balancing the switching transient behavior.

BRIEF DESCRIPTION OF THE DRAWINGS

Additional refinements, advantages and features of the present disclosure are described in more detail below with reference to exemplary embodiments illustrated in the drawings, in which:

FIGS. 7 and 8 show measured results of the operation of an exemplary embodiment of the present disclosure at turn-on and turn-off of the components.

DETAILED DESCRIPTION

Figure 1:
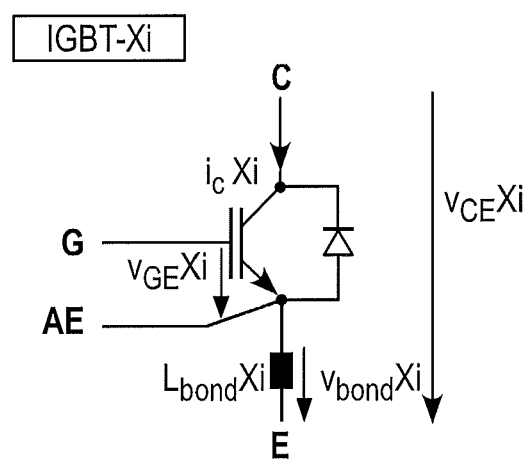
FIG. 1 shows an IGBT component according to an exemplary embodiment of the present disclosure, with a definition of its variables.

Exemplary embodiments of the present disclosure provide a method and an arrangement for balancing the switching transient behavior of parallel connected power semiconductor components.

Exemplary embodiments of the present disclosure are based on the idea of measuring the time differences between the beginning and the end or both times of the current rise or fall of the parallel power semiconductor components, and compensating the time differences in respective following state changes. The time differences are measured from the voltages which are induced to the inductances in the current path. The induced voltage is proportional to the derivative, for example, the rate of change of the current.

The measurement of an induced voltage is much simpler and cheaper than the measurement of current. Further, the induced voltage, being the derivative of the current, changes more rapidly than the current itself, and is therefore very well suited for producing timing information.

The observed time differences between the parallel components are compensated for using an electronic circuitry. Accordingly, exemplary embodiments of the present disclosure limit the current unbalance of parallel components during switching transients by a simple measure which does not require expensive and/or bulky additional components.

Exemplary embodiments of the present disclosure provide a low cost structure with a minimum of additional losses. Further, the structure has a low weight and volume. It also saves labor costs during the development, manufacturing and service of industrial converters.

Exemplary embodiments of the present disclosure enable a current balancing of parallel devices regardless of the component type. The same structure can be used for balancing the currents of IGBT, MOSFET and IGCT components, for example. In addition, exemplary embodiments of the present disclosure have no requirements for the driver of the components.

Further, the adjustment of the timing of the gate signals by an analysis of time intervals of rates of current change enables the balancing of parallel device currents due to several reasons, for example, unbalances due to different semiconductor characteristics, such as variations of VGE, switching times and gate unit differences (e.g., gate unit delay times, differences of gate resistors, etc.), and stray inductance differences, etc. Accordingly, exemplary embodiments of the present disclosure correct the timing differences between parallel components, no matter what the origin of the difference is. The exemplary embodiments of the present disclosure also correct the unbalance even if it is due to drift of the parameters of the switch components.

The detection of time intervals of rates of current change can be additionally used for the short circuit protection, and if the relation between the stray inductances (measured stray inductances) is known and static, the measurement adds useful information for the static balance. Thus, additional effort for the short circuit detection on the gate unit can be avoided.

FIG. 1 shows a drawing symbol of an IGBT component with associated symbols and definitions that are used throughout the description of the present disclosure. The IGBT component is denoted as Xi and it has a collector C, gate G and emitter E terminals. Further, the component has an auxiliary emitter AE which is connected to the same potential as the emitter E and intended to be connected to the driver circuit or gate unit, so that a suitable voltage can be led between the gate and emitter terminals for controlling the component.

Further definitions in FIG. 1 are collector current $i_{C,Xi}$, gate to emitter voltage $v_{GE,Xi}$ and collector to emitter voltage $v_{CE,Xi}$. $L_{bond,Xi}$ is the stray inductance of the switching path of the component, and $v_{bond,Xi}$ is the voltage over the stray inductance.

In accordance with an exemplary embodiment of the method and arrangement, a switch signal is provided to the parallel connected semiconductor components for changing the state of the components. The switch signal is triggered by the control system of the device in which the method is implemented. The control system may be, for example, a modulator or similar operational structure which outputs a signal for initiating the change of state of the controlled component. The change of state refers to change from the conducting state to the blocking state, or from the blocking state to the conducting state.

The switch signal is led to a gate circuitry or gate units for carrying out the actual gate control. Each parallel connected switch component has its dedicated gate unit, and these gate units form control signals for controlling the parallel connected components. Gate units may be, for example, gate drivers with all the necessary circuitry for providing required control voltage to the gate of the component.

In accordance with an exemplary embodiment of the present disclosure, the voltage of an inductance connected in series with the IGBT to the switching path is determined in order to observe the variations of the collector or emitter current of the parallel IGBTs. The inductance used may be, for example, the internal stray inductance of the IGBT module or component. The variations of the current are, for example, the beginning, duration or end of the current rise or fall, or a sign of the slope of the current.

The measured voltages are compared and evaluated, and the timing information of the IGBT collector or emitter currents is extracted. This information allows for a control or compensation system to calculate the adapted delay times for the next switching transients in order to reach some particular goal, for example, the dynamic current balance.

The calculated delay times are used for modifying the timing of the next respective switching by modifying the control signal. The modification may be carried out either by modifying the switch signals $v_{CTRL,Xi}$ to the gate units or by modifying the gate to emitter voltages $v_{GE,Xi}$ that are generated by the gate units. Thus, the control signal can be considered to be a signal splitted from the switch signal either before or after the gate unit (e.g., signals going to the gate units or a signal departing from the gate units).

Figure 2:
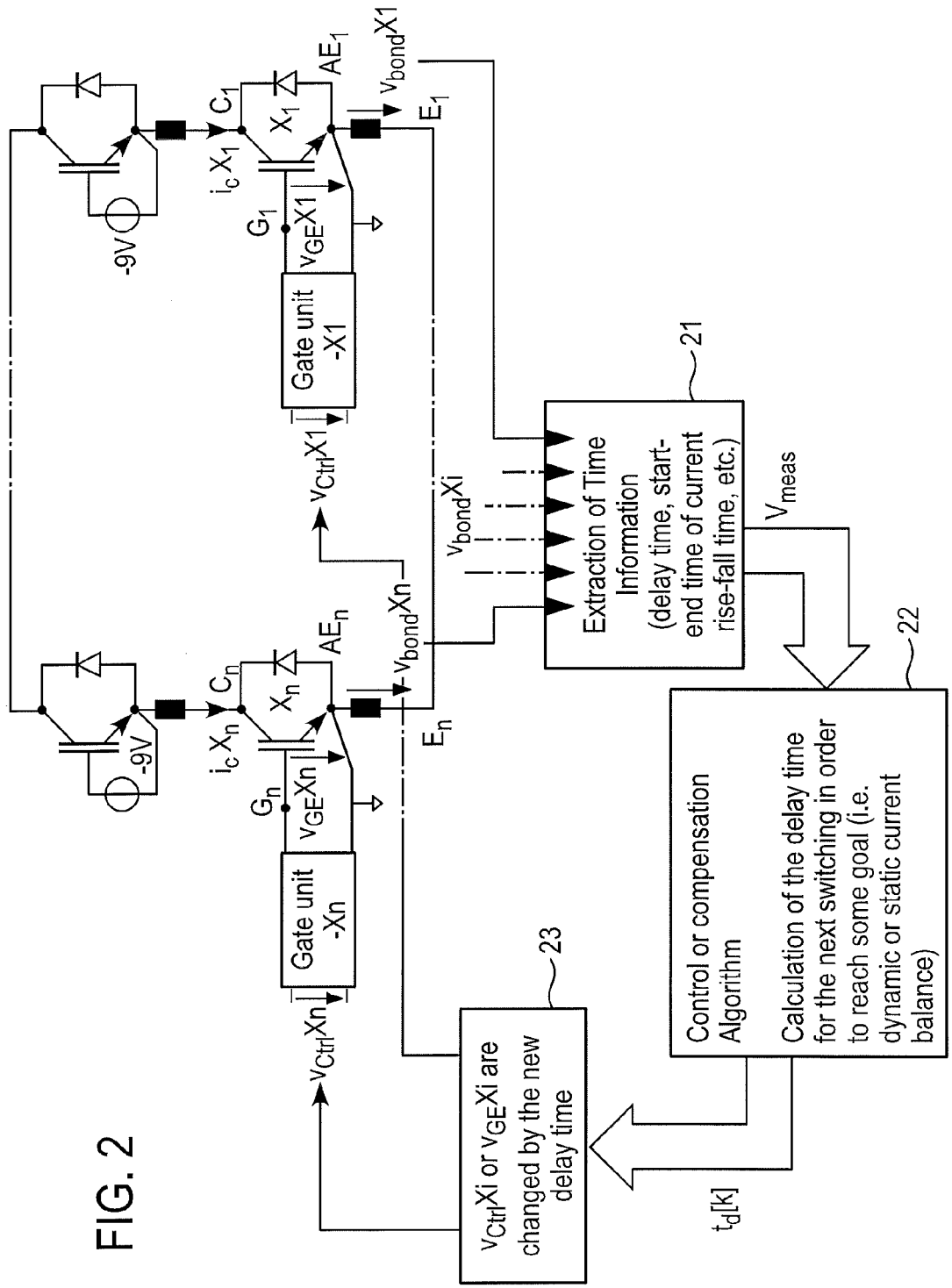
FIG. 2 shows a block diagram of an exemplary embodiment of the present disclosure.

A simplified block diagram is presented in FIG. 2. The diagram assumes n parallel connected IGBTs where Xi represents the i parallel IGBT (i=1 to n). $v_{bond,Xi}$ is voltage across the stray inductance $L_{bond,Xi}$ in the IGBT module or in the switching path. Block 21 receives voltage signals from the parallel IGBTs and outputs $v_{meas}$, which is an array of voltages with information on time differences of the rising or falling IGBT emitter or collector currents extracted from the signals $v_{bond,Xi}$.

The new calculated delay values for the next switching transient are calculated in block 22 and sent to block 23 in the array $t_d[k]$ to be taken into account in the following respective state change. As mentioned above, the delay values can be taken into account in signals going to the gate units or in a signal departing from the gate units.

Figure 3:
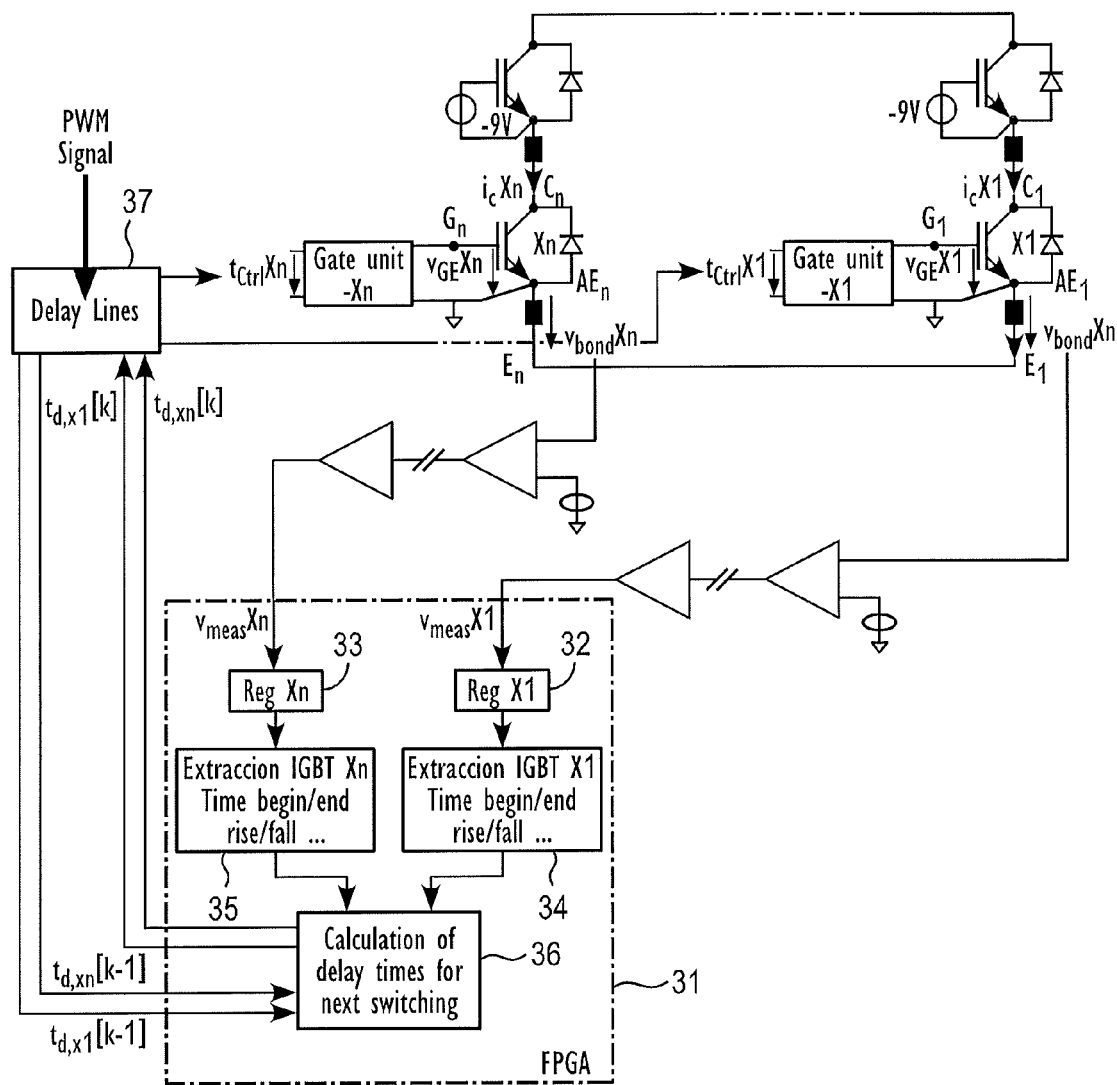
FIG. 3 shows a more detailed block diagram of an exemplary embodiment of the present disclosure.

An exemplary embodiment of the present disclosure is presented in FIG. 3. In this embodiment, the voltage $v_{bond,Xi}$ of two IGBTs is measured by a compensated voltage divider (e.g., resistive-capacitive) and compared to a threshold value in order to obtain the digital signals $v_{meas,Xi}$, which are fed to the FPGA circuit and loaded to registers Reg X1 32 and Reg Xn 33. The extraction of the time instant of the beginning of the rise or fall of the collector current is carried out by a processor executing an algorithm in an FPGA in blocks 34, 35 and 36. The calculated delay times are fed to delay lines 37, which also receive the PWM signal, which is the signal for controlling the switch components. The PWM signal is then modified and fed to the switch components.

FIGS. 2 and 3 show a series connection of switch components. In accordance with an exemplary embodiment, the switch components may be used in a power modifying apparatus, such as an inverter, in which the power stage includes upper and lower switches with which either positive or negative voltage can be controlled to the output, which is situated between the upper and lower switches. The upper switches are shown in FIGS. 2 and 3 for illustrational purposes only. However, the inventive idea can, and usually is, adapted to all parallel connected switches similarly to those that are described in a more detailed manner.

In accordance with an exemplary embodiment, the calculation of the next delay times for the gate signal of the parallel IGBTs on the basis of the time differences of the beginning of the rise or fall in the collector current is implemented in an FPGA, as well as delay lines at the input of the gate unit signals, which allow the modification of the timing of the gate unit control signals ($v_{Ctrl,Xi}$).

Figure 4:
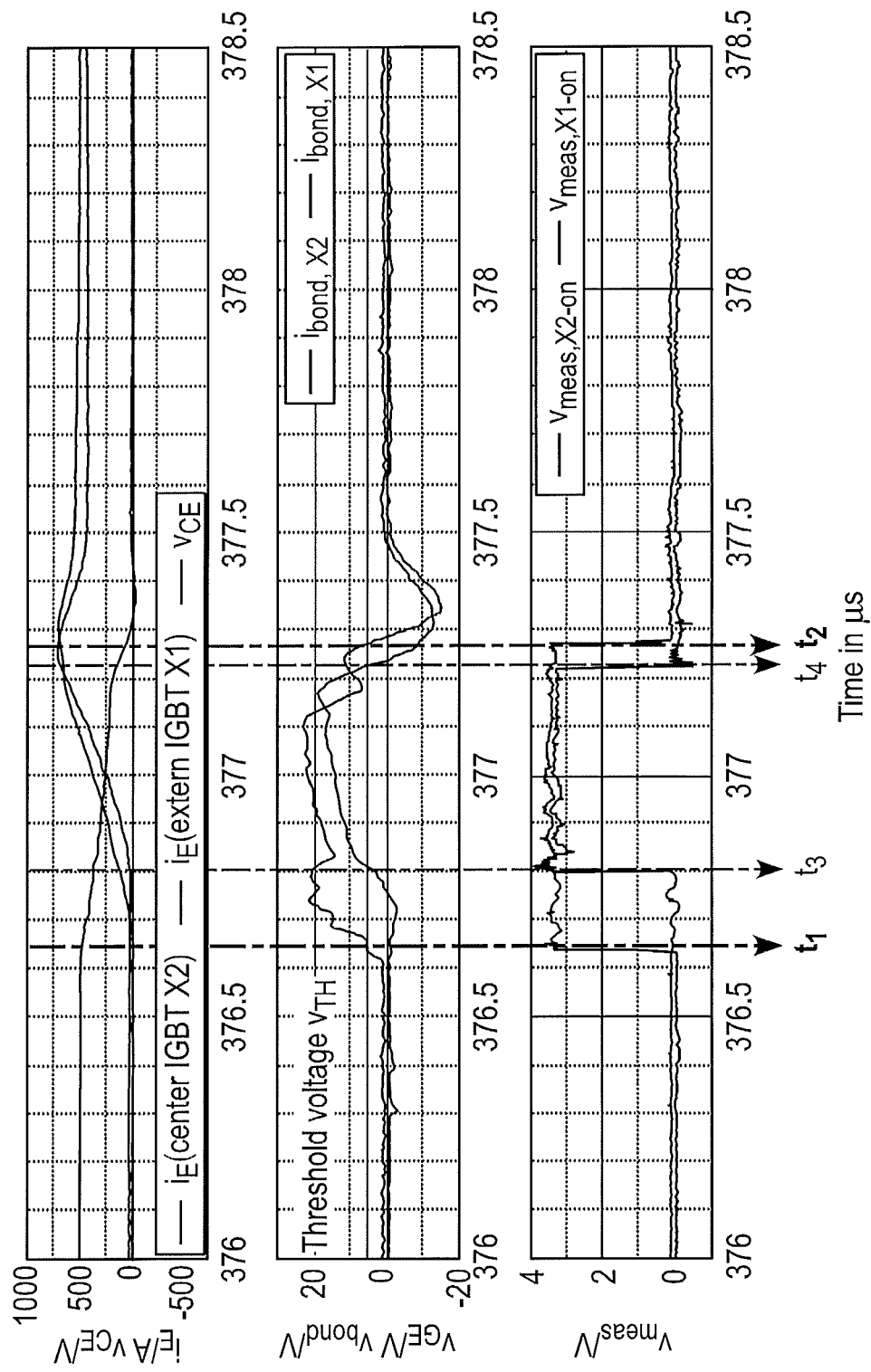
FIG. 4 shows measurements relating to the operation of an exemplary embodiment of the present disclosure.

The voltage $v_{bond,Xi}$ is measured during the switching by a compensated voltage divider (e.g., resistive-capacitive). $v_{bond,x1}$ and $v_{bond,x2}$ are compared with a threshold voltage $v_{TH}$ which generate $v_{meas,X1}$ and $v_{meas,X2}$, as shown in FIG. 4. The uppermost plot in FIG. 4 shows the rise of the collector currents and the fall of the collector to emitter voltage during the turn-on of the component. The middle plot in FIG. 4 shows the voltage of the inductance during the switching. The voltage is proportional to the time derivative of the collector current. The voltage of the inductance is compared with the threshold voltage, and as the voltage crosses the threshold, voltage $v_{meas}$ is switched to the high state, as shown in the lowest plot of FIG. 4. The lowest plot shows time instants $t_1$, $t_2$, $t_3$ and $t_4$. Time instants $t_1$ and $t_2$ are the instants at which the measured voltage first reaches the threshold when rising ($t_1$) and falling ($t_2$), and time instants $t_3$ and $t_4$ are similar instants for the other switched component. The time difference between $t_1$ and $t_3$ is the delay between the components, and it is calculated later in the FPGA.

Figure 5:
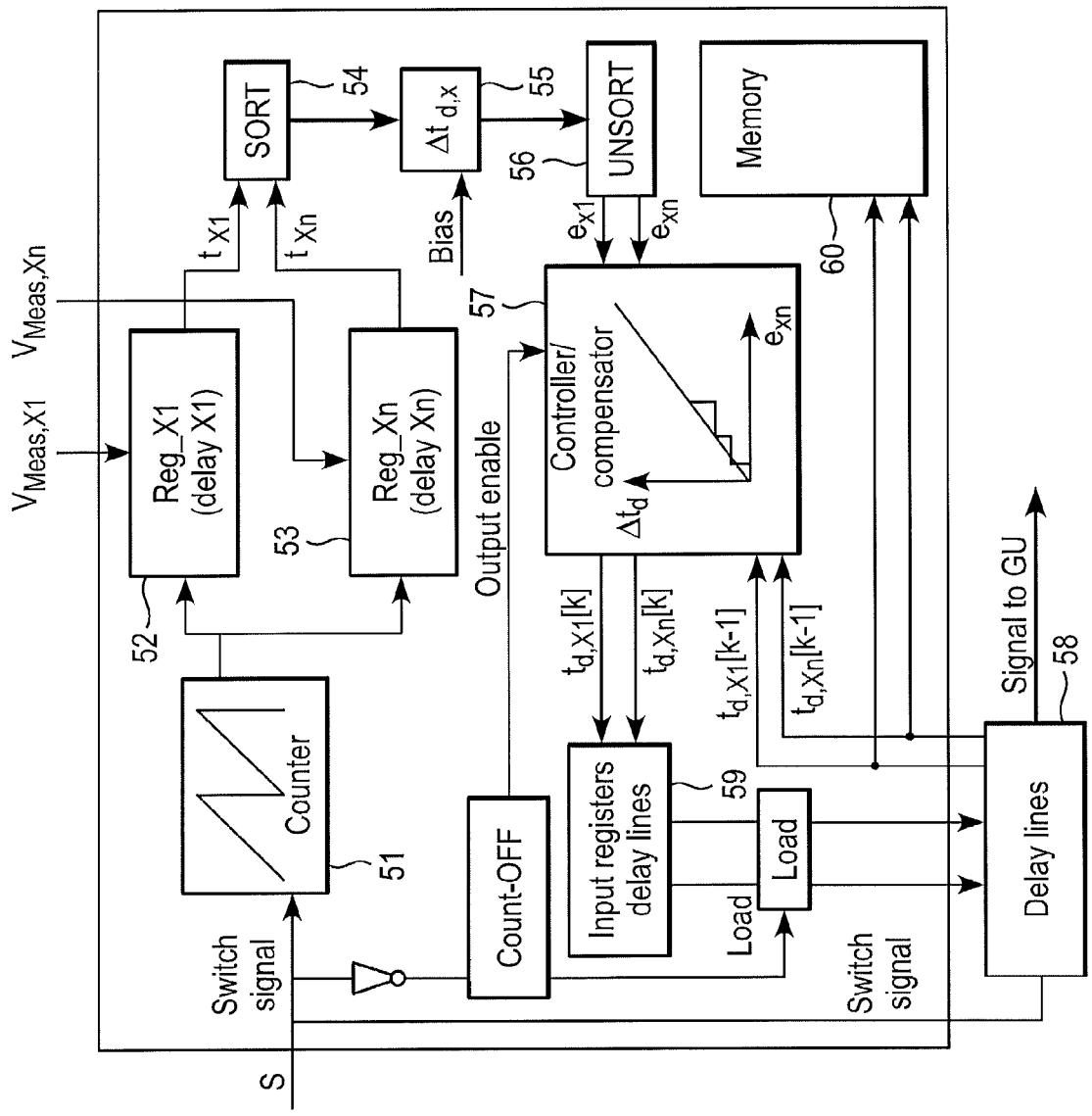
FIG. 5 shows a block diagram of the functions of an exemplary embodiment of the present disclosure.

A block diagram of the functions implemented in the FPGA according to an exemplary embodiment is shown in FIG. 5. This circuit receives inputs $v_{meas,X1}$ to $v_{meas,Xn}$ from the measurement circuit and the PWM switch signal from the modulator or controller. The compensation system delivers delay values for the delay lines implemented in the FPGA.

The operation principle of the implemented logic in the FPGA for turn-on is as follows. The rising edge of the switch signal s starts a counter 51, which may be, for example, a 133 MHz 8 bit counter, achieving about 7 ns correction steps.

The actual value of the counter is loaded into registers Reg_X1 to Reg_Xn as soon as a low-to-high transition of signal $v_{meas,X1}$ to $v_{meas,xn}$ is detected. Thus, the value of counter 51 is loaded into registers at the time instant when the induced voltage crosses the set threshold value.

Once the values have been loaded into the register, the smallest value in registers Reg_X1 to Reg_Xn is subtracted from each register. The results of the subtractions are written in registers $e_{x1}$ to $e_{xn}$. In the exemplary implementation of FIG. 5, the subtraction is carried out by sorting 54, biasing 55 and unsorting 56 the data. Due to this subtraction, one of the registers receives zero as the value of delay.

The values of registers $e_{x1}$ to $e_{xn}$ are read by the control block 57 at the next high-to-low transition of signal s. The control block 57 changes the stored values outputted by a counter to values representing time.

The control block 57 provides values $t_{d,Xj}[k]$, i=1,...,n for delay lines 58 for step k based on the delay values of step k−1 used for the previous turn-on transient and the values in the registers $e_{Xi}[k-1]$ to $e_{Xn}[k-1]$ which also result from the last turn-on transient. The new values $t_{d,Xi}[k]$ for the delay lines are loaded into its input register 59 about 2 µs, for example, after the high-to-low transition of signals. The switch signal is fed to the delay lines 58 and the switch signal with delays is fed to gate units GU. The signal to the gate units is represented as a single arrow. It is to be understood that in the example of FIG. 5, the signal is composed of two signals for both of the parallel switch components. As mentioned above, the delay can be taken into account in the gate units instead of the signals to the gate unit. When the modification is taken into account in the gate units, each of the parallel gate units receives the control signal at the same time and processes the modification such that gate voltages are produced at different times. If the delay is taken into account in the control signal to the gate units, each of the parallel gate units receive the modified signals and produces the gate voltage instantly.

FIG. 5 also shows a memory block 60 to which the used delay times are fed and stored. The memory can be read for the purposes of analyzing the delay data. In accordance with an exemplary embodiment, the memory block 60 includes a non-transitory computer-readable recording medium such as a hard disk drive, optical memory, flash memory or other types of non-volatile memories.

The operation principle for turn-off is similar, the only change being the use of the complementary signal of s as the trigger for the process.

Figure 6:
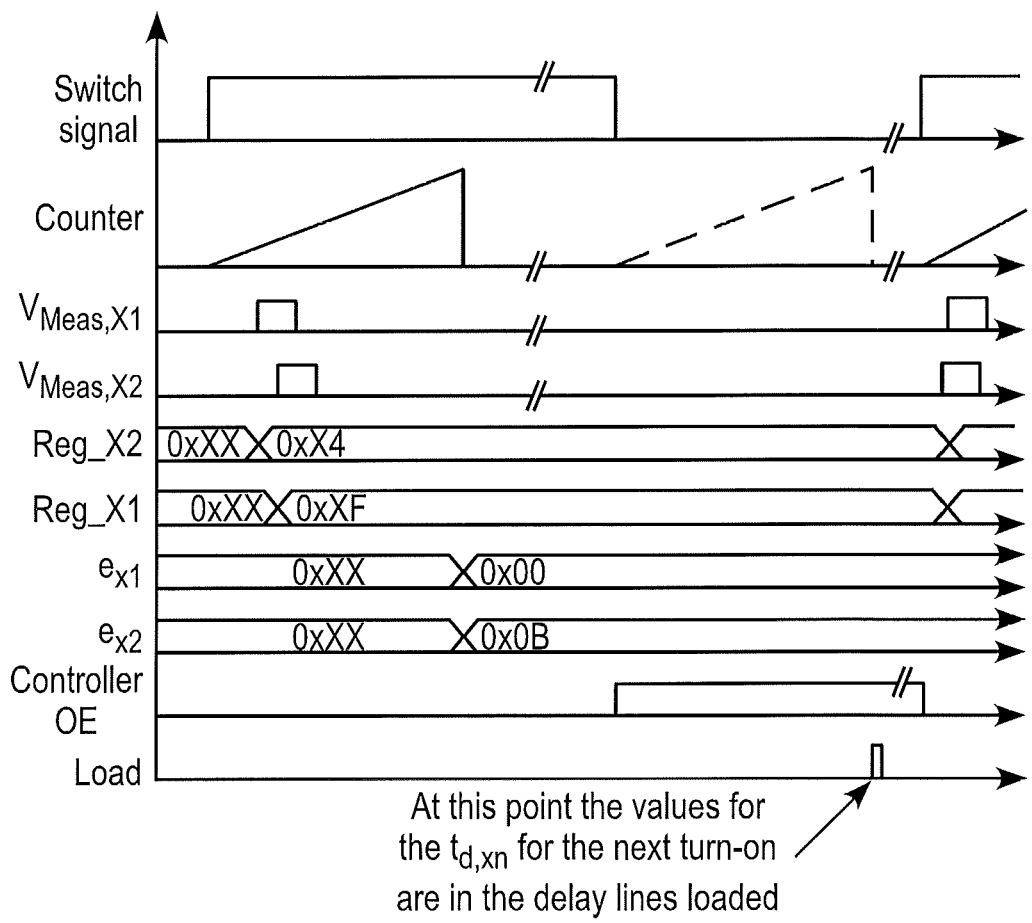
FIG. 6 shows a timing diagram of the operation of an exemplary embodiment of the present disclosure.

A timing diagram for the turn-on operation is presented in FIG. 6 to illustrate the timing of the signals in the implementation of an exemplary embodiment of the present disclosure. It can be seen from FIG. 6 that as the switch signal is received, the counter starts the operation. When voltages $v_{Meas,X1}$ and $v_{Meas,X2}$ are received, the value of the counter is read to registers Reg_X1 and Reg_X2. As the counter is reset, the values from the registers Reg_X1 and Reg_X2 are shifted to registers $e_{x1}$ and $e_{x2}$ with the lowest value of the registers subtracted from all the registers. When the switch signal changes from high to low, the output of the controller is enabled, and the new values for delay lines are loaded into the input register of the delay lines. The values for the delay are then loaded into the delay lines.

In accordance with an exemplary embodiment of the present disclosure, the previously used compensating delay is taken into account in the calculation of the following delay. If, for example, the previous delay time $t_{d,X1}[k-1]$ was x nanoseconds, and the measurement of voltages (using x nanoseconds as the delay) gives a result that the delay $\Delta t_d$ for the same component should be corrected by y nanoseconds for the following similar switch action, then the previous delay time $t_{d,X1}[k-1]$ is summed with the new delay $\Delta t_d$ for obtaining the delay time $t_{d,X1}[k]$ for the following switch action.

In accordance with the above-described exemplary embodiment, the generation of the delay time is described in digital form using a digital circuit. The disclosure can be carried out by using analog logic circuits in generation of the delay values.

FIG. 6 shows an example of the measurement results of an exemplary embodiment of the present disclosure at turn-on transients. FIG. 6a shows the unbalanced system with a 100 ns delay time difference between the collector currents. FIG. 6b shows the balanced system in which the delay is compensated. The subplots from top to bottom show emitter currents $i_E$ and collector to emitter voltage (top), gate to emitter voltage and measured induced voltage (middle), and voltage generated for timing information $v_{meas}$ (bottom) by comparing the induced voltage with a threshold voltage.

Figures 7A, 7B:
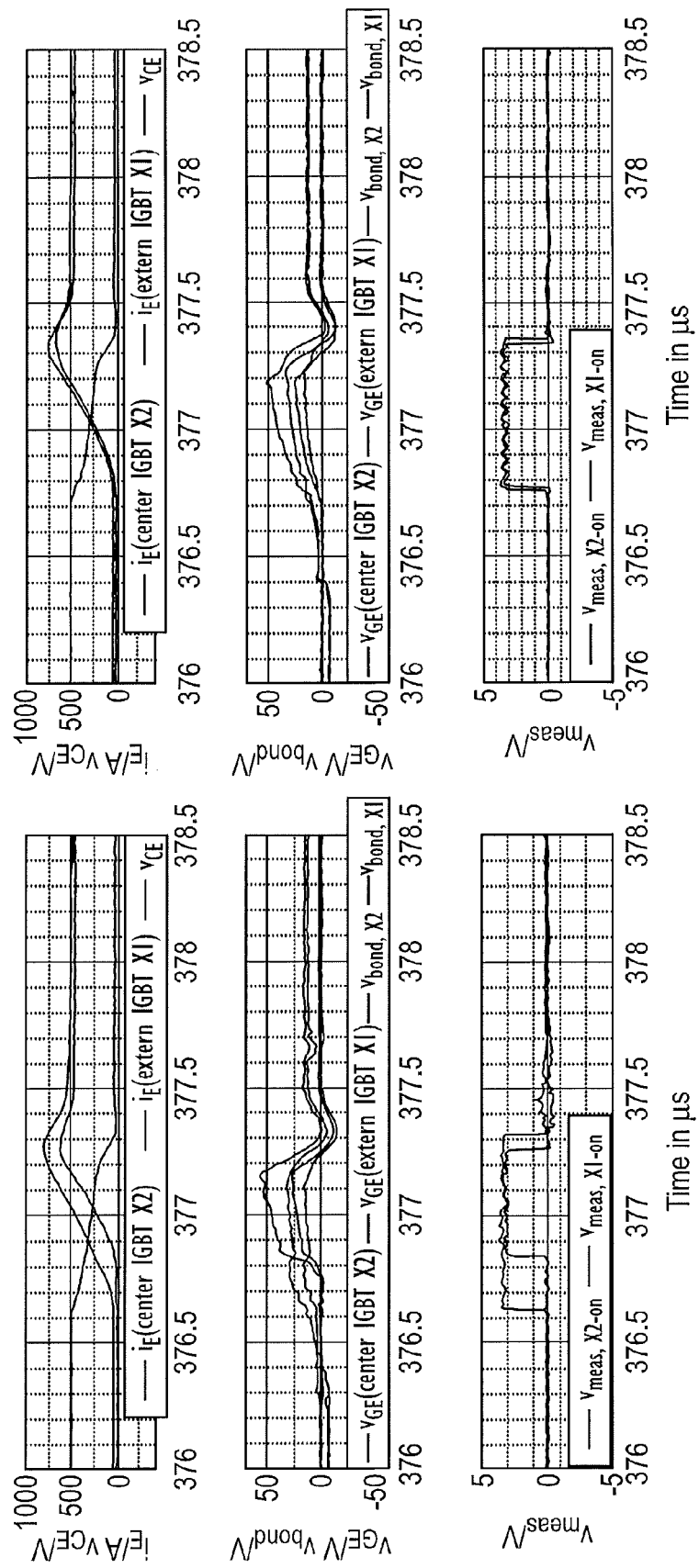

FIG. 7 shows the measurement results at turn-off transients according to an exemplary embodiment of the present disclosure. FIG. 7a shows the unbalanced system (100 ns delay time difference between the collector currents) and FIG. 7b the balanced system. The balancing effect of the present disclosure on the current distribution of parallel IGBTs can be clearly appreciated. The explanations of the subplots are similar to those of FIG. 6.

In accordance with exemplary embodiments of the present disclosure, the rates of current change are measured indirectly by the measurement of a voltage, across an inductance in series to the IGBTs. In IGBT modules, this inductance could be, for example, the module internal stray inductance $L_{bond,Xi}$, see FIG. 1 (e.g., the inductance between the main emitter terminal and the auxiliary emitter for control unit connection). However, the inductance could also be an external inductance in series to the IGBT. The time differences (e.g., beginning, duration or end of the current rise or fall, a sign of the slope, etc.) between the measured voltages $v_{bond,Xi}$, which indicate rates of current change of parallel IGBTs, can be used as an input for a time delay compensation unit which balances the points at the moment when the switching transients are initiated. The timing of the gate signals are adjusted such that the resulting device currents of parallel IGBTs are balanced after the corresponding switching transients.

The measurement of voltage $v_{bond,Xi}$ can be carried out by using any suitable measurement arrangements. The measurement may be a direct voltage measurement or it can be a capacitive or inductive measurement. It is also clear that analog to digital converters can be used in the measurement of the voltages.

In the exemplary embodiments described above, the functions were described in detail with reference to FPGA circuitry. FPGA is only one example of digital devices suitable for such operation. Other examples include the use of MSP, DSP, micro controller, etc.

Variations in the parameters to be extracted are also possible. Exemplary embodiments of the present disclosure were described above in connection with extracting only the beginning of the current rise or fall. It is also possible to obtain information from the end of the current rise or fall, the duration or a sign of the rise or fall time, or any combination of these. Variations in the structure of the controller or compensator, or in the implementation of the delay lines are also possible. The construction of some other structure or device that allows the control of the delay of signals like the delay lines is another possible variation of the implementation.

It will be obvious to a person skilled in the art that, as the technology advances, the inventive concept can be implemented in various ways. The disclosure and its embodiments are not limited to the examples described above but may vary within the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

CITATION OF DOCUMENTS

[1] J.-F. Chen, J.-N. Lin, and T.-H. Ai, "The techniques of the serial and paralleled igbts," in Industrial Electronics, Control, and Instrumentation, 1~J96. Proceedings of the 19B6 IEEE IECON 22nd International Conference on, vol. 2, August 1g96, pp. 9g9-1004 vol. 2.

[2] H. Miyazaki, H. Fukumoto, S. Sugiyama, M. Tachikawa, and N. Azusawa, "Neutral-point-clamped inverter with parallel driving of igbts for industrial applications," Industry Applications, IEEE Transactions on, vol. 36, no. 1, pp. 146-151, January/February 2000.

[3] C. Abbate, O. Busatto, L. Fratelli, F. Iannuzzo, B. Cascone, and C. Giannini, "Series connection of high power igbt modules for traction applications, in Power Electronics and Applications, 2005 European Conference on, 0-0 2005, pp. 8 pp.-P. 8.

[4] J. Thalheim, N. Felber, and W. Fichtner, "A new approach for controlling series-connected igbt modules," in Circuits and Systems, 2001. ISCAS 2001. The 2001 IEEE International Symposium on, vol. 3, May 2001, pp. 69-72 vol. 2.

[5] S. Musumeci, R. Pagano, A. Raciti, F. Frisina, and M. Melito, "Parallel strings of igbts in short circuit transients: analysis of the parameter influence and experimental behavior," in IECON 02 [Industrial Electronics Society, IEEE 2002 28th Annual Conference of the], vol. 1, November 2002, pp. 555-560 vol. 1.

[6] J V. Wang, M. Abu Khaizaran, and P. Palmer, "Controlled switching of high voltage igbts in series," in Electron Devices and Solid-State Circuits, 2003 IEEE Conference on, December 2003, pp. 297-300.

[7] R. Hermann, "Investigation of the parallel connection of Integrated Gate Commutated Thyristors and diodes for high current converters", PhD. Thesis, TU-Berlin, May 2009.

What is claimed is:

1. A method of balancing switching transient behavior of parallel connected power semiconductor components, the method comprising:
   providing a switch signal to the parallel connected power semiconductor components to change a state of the components;
   forming control signals for each of the parallel connected components from the switch signal;

determining, during the change of state of the power semiconductor components, a voltage induced to an inductance in a main current path of each component, respectively;

comparing each of the induced voltages with a predetermined threshold voltage;

measuring time differences between time instants at which the induced voltages cross the threshold voltage; and modifying at least one of the control signals on the basis of the measured time differences in a respective following state change of the components for balancing the switching transient behavior.

2. A method according to claim 1, wherein at least one of the control signals is modified before the at least one of the control signals is fed to corresponding gate units of the components, respectively.

3. A method according to claim 1, wherein the time instants at which the induced voltages cross the threshold voltage are the instants at which the induced voltage falls.

4. A method according to claim 2, wherein the inductance in the main current path comprises a stray inductance of the component.

5. A method according to claim 4, wherein the modifying of at least one of the control signals comprises:

adding a delay term obtained in a previous state change to a previously used delay term to obtain a sum of the delay terms; and using the obtained sum as a delay term for delaying the at least one of the control signals.

6. A method according to claim 5, wherein the time instants at which the induced voltages cross the threshold voltage are the instants at which the induced voltage rises.

7. A method according to claim 5, wherein the time instants at which the induced voltages cross the threshold voltage are the instants at which the induced voltage falls.

8. A method according to claim 2, wherein the inductance in the main current path comprises an additional inductive component.

9. A method according to claim 8, wherein the modifying of at least one of the control signals comprises:

adding a delay term obtained in a previous state change to a previously used delay term to obtain a sum of the delay terms; and using the obtained sum as a delay term for delaying the at least one of the control signals.

10. A method according to claim 9, wherein the time instants at which the induced voltages cross the threshold voltage are the instants at which the induced voltage rises.

11. A method according to claim 9, wherein the time instants at which the induced voltages cross the threshold voltage are the instants at which the induced voltage falls.

12. A method according to claim 1, wherein at least one of the control signals is modified at a corresponding gate unit of the components, respectively.

13. A method according to claim 1, wherein the inductance in the main current path comprises a stray inductance of the component.

14. A method according to claim 1, wherein the inductance in the main current path comprises an additional inductive component.

15. A method according to claim 1, wherein the modifying of at least one of the control signals comprises:

adding a delay term obtained in a previous state change to a previously used delay term to obtain a sum of the delay terms; and using the obtained sum as a delay term for delaying the at least one of the control signals.

16. A method according to claim 15, wherein the time instants at which the induced voltages cross the threshold voltage are the instants at which the induced voltage rises.

17. A method according to claim 15, wherein the time instants at which the induced voltages cross the threshold voltage are the instants at which the induced voltage falls.

18. A method according to claim 1, wherein the time instants at which the induced voltages cross the threshold voltage are the instants at which the induced voltage rises.

19. An arrangement of balancing switching transient behavior of parallel connected power semiconductor components, wherein the arrangement comprises:

means for providing a switch signal to the parallel connected power semiconductor components for changing a state of the components;

means for forming control signals for each of the parallel connected components from the switch signal;

means for determining, during the change of state of the power semiconductor components, a voltage induced to an inductance in a main current path of each component, respectively;

means for comparing each of the induced voltages with a predetermined threshold voltage;

means for measuring time differences between time instants at which the induced voltages cross the threshold voltage; and means for modifying at least one of the control signals on the basis of the measured time differences in a respective following state change of the components for balancing the switching transient behavior.

20. An arrangement according to claim 19, wherein the means for modifying the at least one of the control signals modifies the at least one of the control signals before the at least one of the control signals is fed to corresponding gate units of the components, respectively.

21. An arrangement according to claim 19, wherein the means for modifying the at least one of the control signals modifies the at least one of the control signals at a corresponding gate unit of the components, respectively.

22. An arrangement according to claim 19, method according to claim 1, wherein the inductance in the main current path comprises a stray inductance of the component.

23. An arrangement according to claim 19, wherein the inductance in the main current path comprises an additional inductive component.

24. An arrangement according to claim 19, wherein the means for modifying at least one of the control signals comprises:

means for adding a delay term obtained in a previous state change to a previously used delay term to obtain a sum of the delay terms; and means for using the obtained sum as a delay term for delaying the at least one of the control signals.

25. An arrangement according to claim 19, wherein the time instants at which the induced voltages cross the threshold voltage are the instants at which the induced voltage rises.

26. An arrangement according to claim 19, wherein the time instants at which the induced voltages cross the threshold voltage are the instants at which the induced voltage falls.

* * * * *